United States Patent
Reinmuth et al.

(10) Patent No.: US 8,299,549 B2
(45) Date of Patent: Oct. 30, 2012

(54) LAYER STRUCTURE FOR ELECTRICAL CONTACTING OF SEMICONDUCTOR COMPONENTS

(75) Inventors: Jochen Reinmuth, Reutlingen (DE); Peter Schmollngruber, Aidlingen (DE); Hans Artmann, Boeblingen-Dagersheim (DE)

(73) Assignee: Robert Bosch GmbH, Stuttgart (DE)

( * ) Notice: Subject to any disclaimer, the term of this patent is extended or adjusted under 35 U.S.C. 154(b) by 155 days.

(21) Appl. No.: 12/953,086

(22) Filed: Nov. 23, 2010

(65) Prior Publication Data
US 2011/0127674 A1   Jun. 2, 2011

(30) Foreign Application Priority Data
Dec. 1, 2009   (DE) .................. 10 2009 047 352

(51) Int. Cl.
*H01L 29/84*   (2006.01)
(52) U.S. Cl. ................. 257/415; 257/757; 257/E23.162
(58) Field of Classification Search .................. 257/415, 257/757, E23.162
See application file for complete search history.

(56) References Cited

U.S. PATENT DOCUMENTS

| 5,285,084 | A * | 2/1994 | von Windheim et al. ........ 257/77 |
| 2007/0052047 | A1* | 3/2007 | Hadjiloucas et al. ......... 257/417 |
| 2007/0148788 | A1* | 6/2007 | Hsieh et al. ....................... 438/3 |

FOREIGN PATENT DOCUMENTS
EP   1 760 442   3/2007

* cited by examiner

*Primary Examiner* — Trung Q Dang
(74) *Attorney, Agent, or Firm* — Kenyon & Kenyon LLP

(57) ABSTRACT

A layer structure for the electrical contacting of a semiconductor component having integrated circuit elements and integrated connecting lines for the circuit elements, which is suitable in particular for use in a chemically aggressive environment and at high temperatures, i.e., in so-called "harsh environments," and is simple to implement. This layer structure includes at least one noble metal layer, in which at least one bonding island is formed, the noble metal layer being electrically insulated from the substrate of the semiconductor component by at least one dielectric layer, and having at least one ohmic contact between the noble metal layer and an integrated connecting line. The noble metal layer is applied directly on the ohmic contact layer.

5 Claims, 3 Drawing Sheets

LAYER STRUCTURE FOR ELECTRICAL CONTACTING OF SEMICONDUCTOR COMPONENTS

FIELD OF THE INVENTION

The present invention relates to a layer structure for electrical contacting of semiconductor components having integrated circuit elements and integrated connecting lines for the circuit elements. This layer structure includes at least one noble metal layer and at least one ohmic contact between the noble metal layer and an integrated connecting line. At least one bonding island is formed in the noble metal layer. In addition, the noble metal layer is electrically insulated from the substrate of the semiconductor component by at least one dielectric layer.

BACKGROUND INFORMATION

In the case of semiconductor components which are used in so-called "harsh environments," the bonding islands, which are formed on the component surface, and the bonding wires, which are used for electrical contacting, are subjected to extreme environmental conditions, such as particularly high or low pressures, particularly high or low temperatures, and/or chemically aggressive media.

The use of pressure sensor elements for monitoring the soot particle filter of a motor vehicle is mentioned here as an example of such an application. For this purpose, the pressure sensors are situated in the exhaust system of the motor vehicle upstream and downstream from the soot particle filter. The load of the soot particle filter may be determined and the burn-off of the filter may be regulated on the basis of the differential pressure.

Corrosion of the bonding islands and bonding wires impairs the electrical contacting of a semiconductor component and therefore its functionality. In order to prevent this, in practice, bonding islands and bonding wires made of gold are typically used for contacting semiconductor components which are intended for use in aggressive measuring media. In addition thereto, the contact areas are frequently also gelled, which limits the possible packaging forms for the semiconductor component, however. In addition, the material properties of the gels used may change due to aging, whereby their protective effect typically decreases.

A layer structure for electrical contacting of a piezoresistive pressure sensor element is described in European Patent No. EP 1 760 442, which was implemented starting from a silicon substrate. The piezoresistors are integrated together with connecting lines into the substrate surface. The substrate surface has been passivated to protect the circuit elements. For this purpose, a silicon dioxide layer was produced as the first passivation layer on the substrate surface and a second passivation layer was produced above it in the form of a silicon nitride or silicon carbide layer. The sensor element is electrically contacted here via an opening in the two passivation layers in the area of the connecting line. For this purpose, an ohmic contact layer made of platinum silicide or tantalum silicide is produced in the surface doping of the connecting line. A dense tantalum or niobium layer is located above it, which functions as an electrically conductive adhesive layer for a noble metal layer. The bonding islands for the electrical contacting of the sensor element are formed in this noble metal layer. The adhesive layer and the noble metal layer accordingly extend over the opening area of the passivation layers, in which the ohmic contact layer is formed, up to the areas of the component surface in which bonding pads are to be situated.

This layer structure has proven to be problematic in multiple aspects when the semiconductor component is used in a chemically aggressive environment. Thus, at temperatures above 150° C., damage of the tantalum or niobium adhesive layer may occur, which may even result in the failure of the component. In addition, the noble metal layer forms a galvanic cell together with the electrically conductive tantalum or niobium adhesive layer in a chemically aggressive medium, if the tantalum or niobium adhesive layer comes into contact with the medium at any point of the component surface, for example, in the edge area of the layer structure or due to layer defects. The conversion of chemical energy into electrical energy occurring in this case also has an impairing effect on the functional capability of the component.

SUMMARY OF THE INVENTION

A layer structure for electrical contacting of a semiconductor component is provided by the present invention, which is particularly suitable for use in a chemically aggressive environment and at high temperatures, i.e., in so-called "harsh environments," and is simple to implement.

This is achieved according to the present invention in that the noble metal layer is applied directly on the ohmic contact layer, i.e., without an electrically conductive intermediate layer which functions as an adhesive layer.

Since the layer structure exclusively includes noble metals for the electrical contacting according to the present invention, a particularly high media resistance is achieved, so that additional gelling may be dispensed with. In addition, it is not possible for a galvanic cell to form in the layer structure provided according to the present invention.

Fundamentally, there are various possibilities for implementing the layer structure according to the present invention for electrical contacting of a semiconductor component, as long as positioning an electrically conductive adhesive layer, which is not made of a noble metal, however, between the ohmic contact and the noble metal layer, in which the bonding islands are formed, is dispensed with.

In the case of semiconductor components based on silicon, in which the circuit elements and the connecting lines are integrated into a silicon substrate, it has proven to be advantageous to implement the ohmic contact in the form of a platinum silicide area within a highly doped surface area of the connecting line. On the one hand, the contact resistance is particularly low in this variant. On the other hand, such an ohmic contact may also be easily produced. For this purpose, a platinum layer is initially applied on the doped substrate surface. In a subsequent temperature treatment step, platinum silicide forms at the interface between the highly doped silicon and the platinum. In the case of this processing sequence for manufacturing an ohmic contact, also using the already provided platinum layer for external electrical contacting and additionally forming bonding islands within this platinum layer for this purpose suggests itself.

Media resistant bond connections are frequently manufactured in practice with the aid of gold wires and so-called gold bond balls. Such gold bond connections adhere particularly well to bonding islands having a gold surface. In an advantageous specific embodiment of the present invention, the platinum layer is therefore provided with a gold coating, which is then structured together with the platinum layer to form bonding islands having a gold surface. In this case, the platinum layer also acts as a diffusion barrier against the penetration of gold into the substrate surface.

In the case of applications in which penetration of gold into the substrate is less critical, the platinum layer may also be completely dispensed with. In this case, the metal plating of the bonding islands solely includes a gold layer.

DETAILED DESCRIPTION

Figure 1:
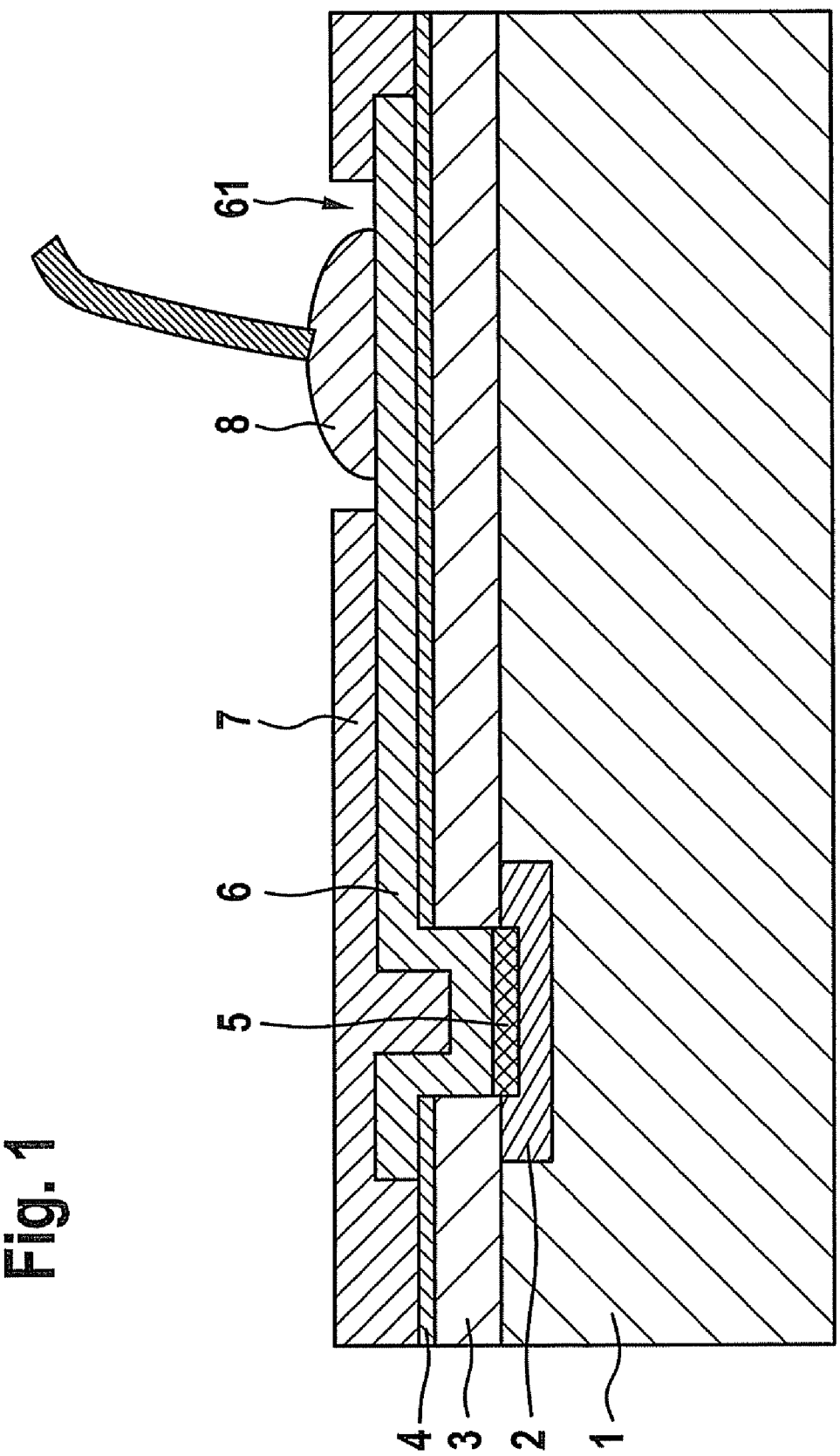
FIG. 1 shows a schematic sectional view of a first layer structure for electrical contacting of a semiconductor component.

Only the connection area of a semiconductor component is shown in all three figures. This may be a micromechanical sensor element or also an electronic component having another functionality, for example. These components were each implemented starting from a silicon substrate 1 and include integrated circuit elements, such as piezoresistors, also having integrated connecting lines. A contact area 2 of such a connecting line is shown in each of FIGS. 1 through 3. Contact area 2 is formed as a highly doped area in the substrate surface. It has dopant concentrations greater than 1E20. In all three exemplary embodiments, the substrate surface was initially passivated using a first dielectric layer 3. This is typically a silicon oxide layer. A second dielectric layer 4 made of silicon nitride has been applied on this first dielectric layer 3, which functions here not only as a passivation layer but rather also as a dielectric adhesive layer. The dielectric material of layers 3 and 4 has been removed again only from contact area 2, in order to form an ohmic contact here. For this purpose, a platinum layer 6 was deposited over the opening in layers 3 and 4. In a subsequent temperature treatment step, platinum silicide 5 is formed at the interface between platinum layer 6 and the highly-doped silicon of contact area 2, which ensures a low-resistance connection to substrate 1.

In the exemplary embodiment shown in FIG. 1, platinum layer 6 has been structured to form a bonding island 61 for a gold wire bond 8, which is situated on the right adjacent to contact area 2 on the component surface. The gold wire is bonded directly on the platinum surface here.

For mechanical protection and also as protection against moisture, the component surface was also provided with a closed passivation layer 7, for example, in the form of a silicon nitride layer.

It is to be noted here that—depending on the application and usage location of the semiconductor component—such a passivation layer may also be dispensed with or instead the component surface may be gelled.

Figure 2:
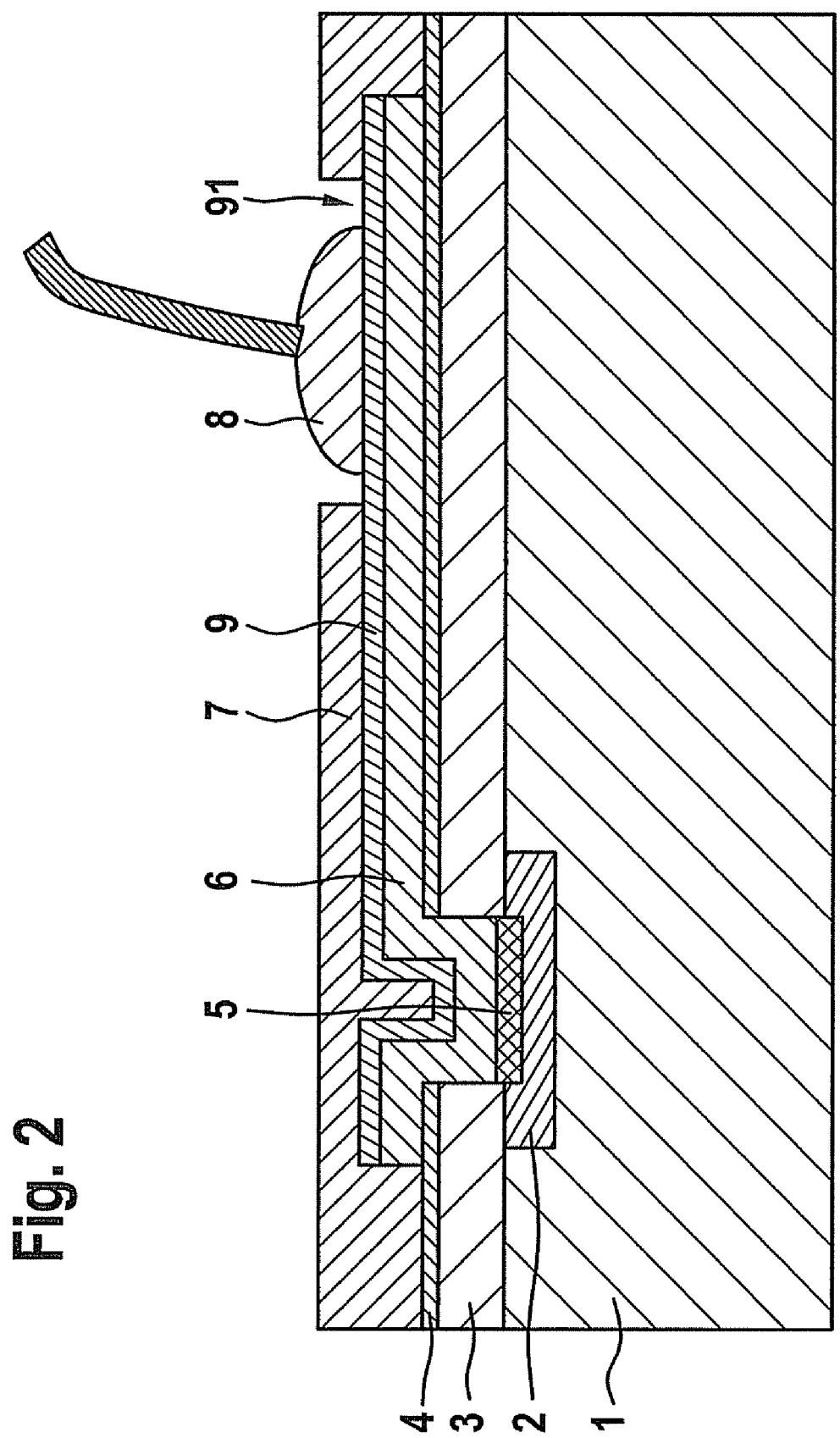
FIG. 2 shows a schematic sectional view of a second layer structure for electrical contacting of a semiconductor component.

In the exemplary embodiment shown in FIG. 2, an additional gold layer 9 has been applied on platinum layer 6. Platinum layer 6 and gold layer 9 have then been structured in an etching step to form a bonding island 91 having a gold surface. The bond connection between bonding island 91 and gold wire bond 8 is substantially more stable than in the case of FIG. 1.

Figure 3:
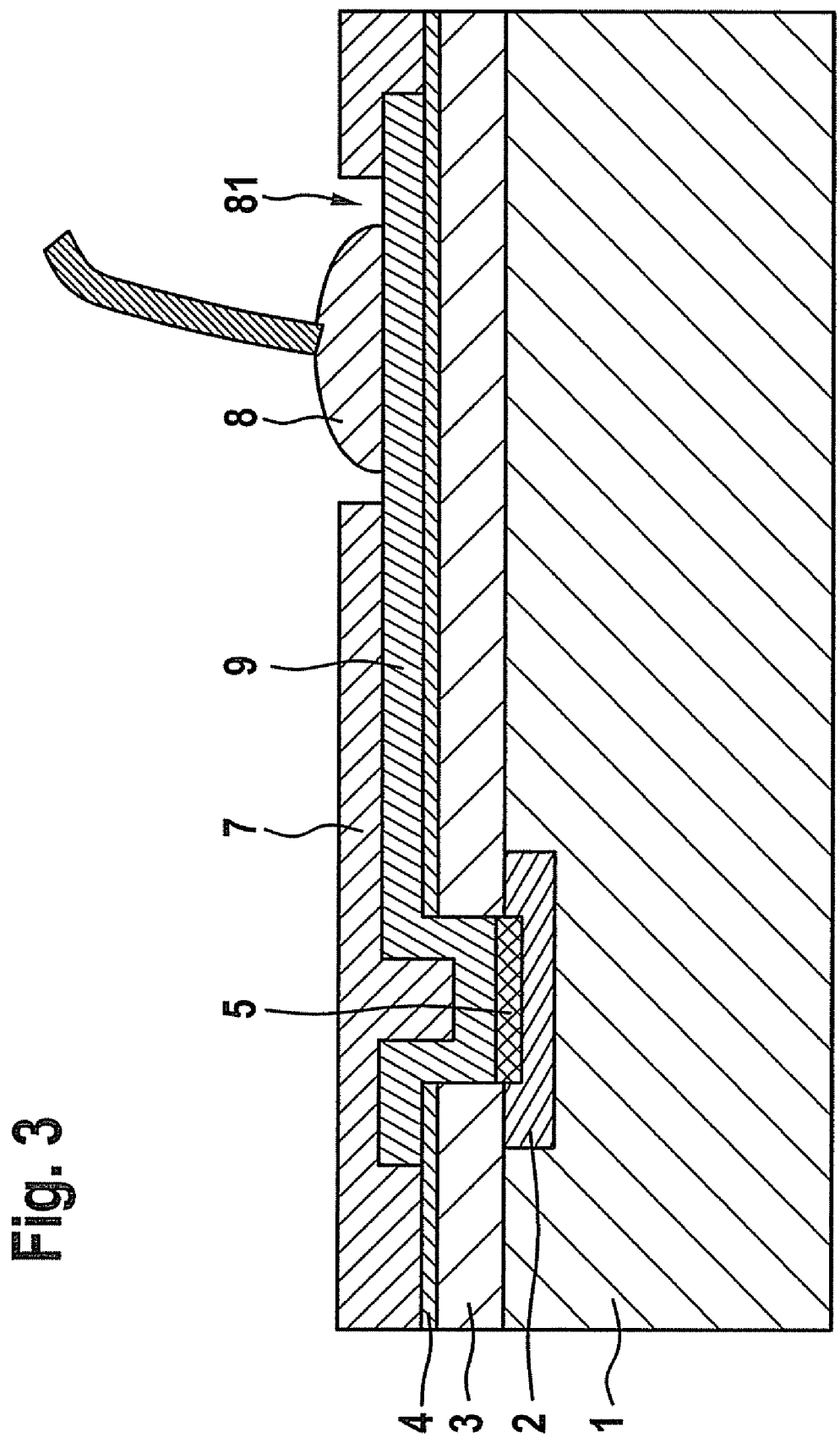
FIG. 3 shows a schematic sectional view of a third layer structure for electrical contacting of a semiconductor component.

A contacting variant is shown in FIG. 3 in which the platinum layer was dispensed with entirely. The excess platinum has been removed here after the formation of platinum silicide contact 5 in highly doped contact area 2. Instead, a gold layer 9 has been deposited over platinum silicide contact 5 and structured to implement a bonding island 81 made of gold for the gold wire bond 8.

What is claimed is:

1. A layer structure for electrical contacting of semiconductor components having integrated circuit elements and integrated connecting lines for the circuit elements, the layer structure comprising:
   at least one noble metal layer, in which at least one bonding island is formed, the noble metal layer being electrically insulated from a substrate of a semiconductor component by at least one dielectric layer; and
   at least one ohmic contact situated between the noble metal layer and an integrated connecting line,
   wherein the noble metal layer is applied directly on the ohmic contact.

2. The layer structure according to claim 1, wherein the circuit elements and the connecting lines are integrated into a silicon substrate, and wherein the ohmic contact includes a platinum silicide area within a highly doped surface area of a connecting line.

3. The layer structure according to claim 2, wherein the at least one noble metal layer includes a platinum layer.

4. The layer structure according to claim 3, wherein the at least one noble metal layer further includes a gold layer applied on the platinum layer.

5. The layer structure according to claim 2, wherein the at least one noble metal layer includes a gold layer.

\* \* \* \* \*